US010756514B1

(12) United States Patent
Zhou

(10) Patent No.: US 10,756,514 B1
(45) Date of Patent: Aug. 25, 2020

(54) STABILIZING A PRECISION ELECTRO OPTICAL OSCILLATOR CLOCK USING AN ENVIRONMENTALLY INSENSITIVE METAMATERIAL DEVICE

(71) Applicant: Department of the Army, U.S. Army CCDC Army Research Laboratory, Adelphi, MD (US)

(72) Inventor: Weimin Zhou, Rockville, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 16/459,657

(22) Filed: Jul. 2, 2019

(51) Int. Cl.
*H01S 5/0687* (2006.01)
*G02B 6/293* (2006.01)
*H01S 3/13* (2006.01)
*H01S 3/137* (2006.01)
*H01S 5/00* (2006.01)
*H03B 21/02* (2006.01)
*H01S 3/107* (2006.01)
*H03B 5/06* (2006.01)

(52) U.S. Cl.
CPC ........ *H01S 5/0687* (2013.01); *G02B 6/29341* (2013.01); *H01S 3/107* (2013.01); *H01S 3/1305* (2013.01); *H01S 3/137* (2013.01); *H01S 5/0085* (2013.01); *H03B 5/06* (2013.01); *H03B 21/02* (2013.01)

(58) Field of Classification Search
CPC ................................................. G02B 6/29341
See application file for complete search history.

(56) References Cited

U.S. PATENT DOCUMENTS

| 6,567,436 B1 * | 5/2003 | Yao ........................ | H01S 5/0683 372/32 |
| 7,151,415 B1 * | 12/2006 | Zhou ....................... | G02F 2/002 331/66 |
| 7,173,749 B2 * | 2/2007 | Maleki .................... | H03B 17/00 250/205 |
| 7,869,472 B2 * | 1/2011 | Maleki ................... | H01S 5/0687 372/20 |

(Continued)

OTHER PUBLICATIONS

Zhai, T., Zhang, X. Epsilon-near-zero metamaterials for tailoring ultrashort pulses. Appl. Phys. B 113, 185-189 (2013). (Year: 2013).*

*Primary Examiner* — Rhonda S Peace
(74) *Attorney, Agent, or Firm* — Alan I. Kalb

(57) ABSTRACT

An oscillator system includes a laser source; a high-Q electro-optical oscillator to generate a high-Q electro-optical oscillator signals having oscillator frequencies; and an environment-insensitive resonator including ENZ metamaterials. The resonator receives a laser from the laser source and generate a feedback signal to lock the oscillator to reduce a phase/frequency noise in the oscillator. An optical system also includes a high-Q electro-optical oscillator to generate a high-Q electro-optical oscillator signal having oscillator frequencies; an environment insensitive signal delay waveguide having an EMNZ metamaterial such that the signal delay waveguide delays the high-Q electro-optical oscillator signal and generates a delayed signal; and a phase-lock circuit to receive the delayed signal from the signal delay waveguide and provide an electrical feedback signal to the oscillator.

20 Claims, 11 Drawing Sheets

(56) References Cited

U.S. PATENT DOCUMENTS

| | | | | |
|---|---|---|---|---|
| 9,094,133 B2* | 7/2015 | Poddar | .................. | H04B 10/61 |
| 9,310,562 B2* | 4/2016 | Zheng | ................ | G02B 6/29341 |
| 2020/0076149 A1* | 3/2020 | Papp | .................... | H01S 3/0057 |
| 2020/0117070 A1* | 4/2020 | Valentine | .............. | G02F 1/3523 |

* cited by examiner

STABILIZING A PRECISION ELECTRO OPTICAL OSCILLATOR CLOCK USING AN ENVIRONMENTALLY INSENSITIVE METAMATERIAL DEVICE

GOVERNMENT INTEREST

The embodiments herein may be manufactured, used, and/or licensed by or for the United States Government without the payment of royalties thereon.

BACKGROUND

Technical Field

The embodiments herein generally relate to electro-optical devices, and more particularly to electro-optical devices for stabilizing oscillators and clocks.

Description of the Related Art

Precision oscillators require a high-quality factor (high-Q) resonator cavity to produce an electromagnetic signal that has a precision frequency that looks like a delta function in the frequency domain. Unfortunately, the higher the Q factor, the more the resonator is sensitive to environmental perturbations such as temperature variation, electromagnetic interference, vibration, and acoustic influence. Therefore, the delta function frequency drifts rendering it unstable over time. To attempt to overcome this delta function frequency drifting, the traditional technique is to isolate the environmental effects by placing the oscillator in a temperature-controlled oven or a sealed metal box such as a Faraday cage. This is a much larger and heavier housing with an acoustic isolator to dampen the vibration energy and other environmental effects in order to maintain frequency stability. However, as a consequence, it significantly increases the oscillator's size, weight, power consumption, and cost (SWaP-C).

SUMMARY

In view of the foregoing, an embodiment herein provides an electro-optical oscillator system comprising a laser source; a high-Q electro-optical oscillator to generate a high-Q electro-optical oscillator signals comprising oscillator frequencies in the optical domain and/or in the microwave electronic domain; and an optical environmentally insensitive resonator comprising epsilon-near-zero (ENZ) metamaterials, wherein the resonator is to receive a laser light from the laser source and generate a feedback signal to lock the high-Q electro-optical oscillator to reduce an environment induced phase/frequency noise in the high-Q electro-optical oscillator. The resonator may lock the high-Q electro-optical oscillator either directly in the optical domain (such as injection lock) or indirectly in the microwave domain using phase-lock-loop. This includes beating a pair of resonator and high Q oscillator signals to measure a phase/frequency difference and provide the feedback signal to the high-Q electro-optical oscillator to reduce the phase/frequency draft/noise. The resonator may lock the high-Q electro-optical oscillator by injecting the high-Q electro-optical oscillator signals to the resonator to tune the oscillator frequencies to obtain a maximum output power at an output of the resonator. The electro-optical oscillator system may comprise a mixer to receive a first output signal from the resonator, receive a second output signal from the high-Q electro-optical oscillator, and generate a third output signal that is a mixing product of the first output signal and the second output signal. The electro-optical oscillator system may comprise a phase lock loop to receive the third output signal from the mixer and provide a phase/frequency difference detection and generate an electrical output signal that represents a phase/frequency error; and a servo electronic control circuit to receive the electrical output signal and convert the electrical output signal to an electric bias to tune a frequency of the high-Q electro-optical oscillator. The resonator may comprise a substrate; an ENZ cladding layer over the substrate, wherein the ENZ cladding layer comprises the ENZ metamaterials; and a vacuum/air cavity or tunnel waveguide embedded in the ENZ cladding layer. The vacuum/air cavity or tunnel waveguide may comprise a disk configuration.

Another embodiment provides a method comprising generating, by a high-Q electro-optical oscillator, a high-Q electro-optical oscillator signal comprising oscillator frequencies; and generating, by a resonator, a feedback signal to lock the high-Q electro-optical oscillator to reduce an environmental induced phase/frequency noise in the high-Q electro-optical oscillator, wherein the resonator comprises epsilon-near-zero (ENZ) metamaterials. The resonator may be formed by a manufacturing process comprising providing a semiconductor substrate; depositing a dielectric layer on the semiconductor substrate; and depositing a first ENZ metamaterial layer on the dielectric layer. The manufacturing process may further comprise depositing a sacrificial material layer on the first ENZ metamaterial layer; and patterning the sacrificial material layer to create a coupling waveguide structure and a sacrificial ring structure. The manufacturing process may further comprise depositing a second ENZ metamaterial layer on the patterned sacrificial material layer; patterning the second ENZ metamaterial layer to create a plurality of holes along an inner portion of the sacrificial ring structure; and removing the sacrificial material layer and sacrificial ring structure to create an air ring in the first ENZ metamaterial layer. The manufacturing process may further comprise annealing the second ENZ metamaterial layer.

Another embodiment provides an electro-optical oscillator system comprising a high-Q electro-optical oscillator to generate a high-Q electro-optical oscillator signal comprising oscillator frequencies; an environment insensitive signal delay waveguide comprising an epsilon- and mu-near-zero (EMNZ) metamaterial, wherein the signal delay waveguide is to delay the high-Q electro-optical oscillator signal and generate a delayed signal; and a phase error detection circuit to receive the delayed signal from the signal delay waveguide and provide an electrical feedback signal to the high-Q electro-optical oscillator. The delayed signal may be used to compare a no-delayed signal with the high-Q electro-optical oscillator signal for the electrical feedback signal to correct an environmentally induced phase noise error of the high-Q electro-optical oscillator signal due to environmental perturbations. The electrical feedback signal may be used as a phase reference for correction of the environmentally induced phase noise error of the high-Q electro-optical oscillator signal. The signal delay waveguide may comprise an epsilon-near-zero (ENZ) metamaterial host/cladding structure; and one or more dielectric rod/particles each having a subwavelength size positioned in the ENZ metamaterial host/cladding structure. The one or more dielectric rod/particles may be arranged to permit light to propagate through the one or more dielectric rod/particles. The delay waveguide is designed such that the value of both permittivity, epsilon, and permeability, mu, are near zero for the operating wavelength of the light. The signal delay waveguide may comprise a plurality of EMNZ unit cells each comprising an ENZ metamaterial host/cladding structure; and a subwavelength sized particle or disk embedded in the ENZ metamaterial host/cladding structure. The plurality of EMNZ unit cells may be arranged to permit light to propagate from unit cell to unit cell. The particle or disk may comprise a semiconductor material such as silicon.

These and other aspects of the embodiments herein will be better appreciated and understood when considered in conjunction with the following description and the accompanying drawings. It should be understood, however, that the following descriptions, while indicating exemplary embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION

Figure 1:
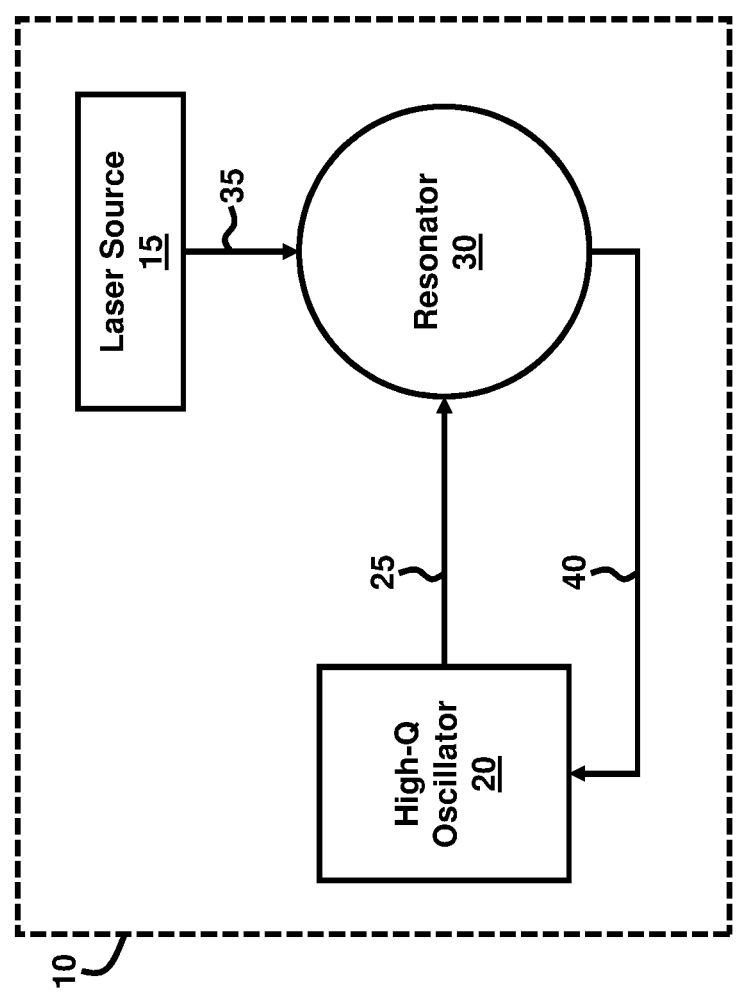
FIG. 1 is a block diagram illustrating an oscillator system that uses an ENZ metamaterial based environmentally insensitive resonator to lock a high-Q electro-optical oscillator, according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein overcome the high SWaP-C housing requirements utilized by the conventional techniques to address the frequency drift issue in high-Q precision oscillators and clocks. The embodiments herein utilize Epsilon- and Mu-Near-Zero (EMNZ) metamaterials for environmentally insensitive optoelectronic devices to stabilize RF-photonic oscillators and clocks and overcome the conventional SWaP-C requirements. According to a first embodiment, an optical resonator cavity can be built using a vacuum or air ring embedded into a refractive index near zero metamaterial claddings such that the resonant frequency is insensitive to variations in temperature, vibration, and electro-magnetic interference. This environmentally insensitive resonator locks a high-quality factor precision oscillator to achieve long term frequency stability without the need to use large sized, heavy weight, and high-power consumption environmental insulation devices. According to a second embodiment, an EMNZ based waveguide delay-line is used that is insensitive to environmental perturbation to delay an oscillator signal. The delayed signal can be used to compare a beat with the oscillator signal, and feedback the beat to correct the environmentally-induced phase error of the oscillator signal due to environmental perturbation.

The environmentally insensitive resonator is configured as a refractive index contrast defined ring/disk where the high index ring is a vacuum/air tunnel waveguide that is enclosed by a near zero index metamaterial cladding. Light is propagated in whisper gallery mode that is mostly in vacuum where the refractive index does not change due to the temperature or vibration. This environmentally insensitive resonator can be used to lock a high-quality factor (high-Q) precision oscillator or clock to correct the environmentally induced phase noise and main stability. Furthermore, the environmentally insensitive waveguide may be configured by a structure made by an EMNZ media where the host material is ENZ (refractive index near zero), which can be used for waveguide cladding. A dielectric material structure is located in the ENZ host material and serves as an inductor to create the EMNZ condition as well as an index guiding for the light. This waveguide can be used to delay an optical oscillator signal without environmentally induced phase change frequency. Therefore, the signal can be fed back to the oscillator to correct the phase noise induced by the environmental change in the resonator cavity.

Referring now to the drawings, and more particularly to FIGS. 1 through 11, where similar reference characters denote corresponding features consistently throughout the figures, there are shown preferred embodiments. In the drawings, the size and relative sizes of components, layers, and regions, etc. may be exaggerated for clarity.

FIG. 1 illustrates an electro-optical oscillator system 10 comprising a laser source 15; a high-Q electro-optical oscillator 20 to generate high-Q electro-optical oscillator signals 25 comprising oscillator frequencies in the optical domain and/or in the microwave electronic domain; and an optical environmentally insensitive resonator 30 comprising epsilon-near-zero (ENZ) metamaterials, wherein the resonator 30 is to receive a laser light 35 from the laser source 15 and generate a feedback signal 40 to lock the high-Q electro-optical oscillator 20 to reduce an environment induced phase/frequency noise in the high-Q electro-optical oscillator 20 for long term stability. The high-Q electro-optical oscillator 20 is configured to provide optical signals (i.e., with frequencies of approximately a few hundred THz) and radio frequency (RF) signals (i.e., with frequencies of approximately 10 GHz). The locking of the high-Q electro-optical oscillator 20 prevents the high-Q electro-optical oscillator 20 from experiencing frequency drift by environmental perturbations. In one example, the ENZ metamaterials may comprise indium tin oxide (ITO) with thermal annealing for a self-assembled polycrystal ENZ metamaterial. In another example, the ENZ metamaterials may comprise a thin nano-layered super-lattice of two materials made by atomic layer deposition (ALD). In still another example, the ENZ metamaterials may comprise a subwavelength resonator array.

Figure 2:
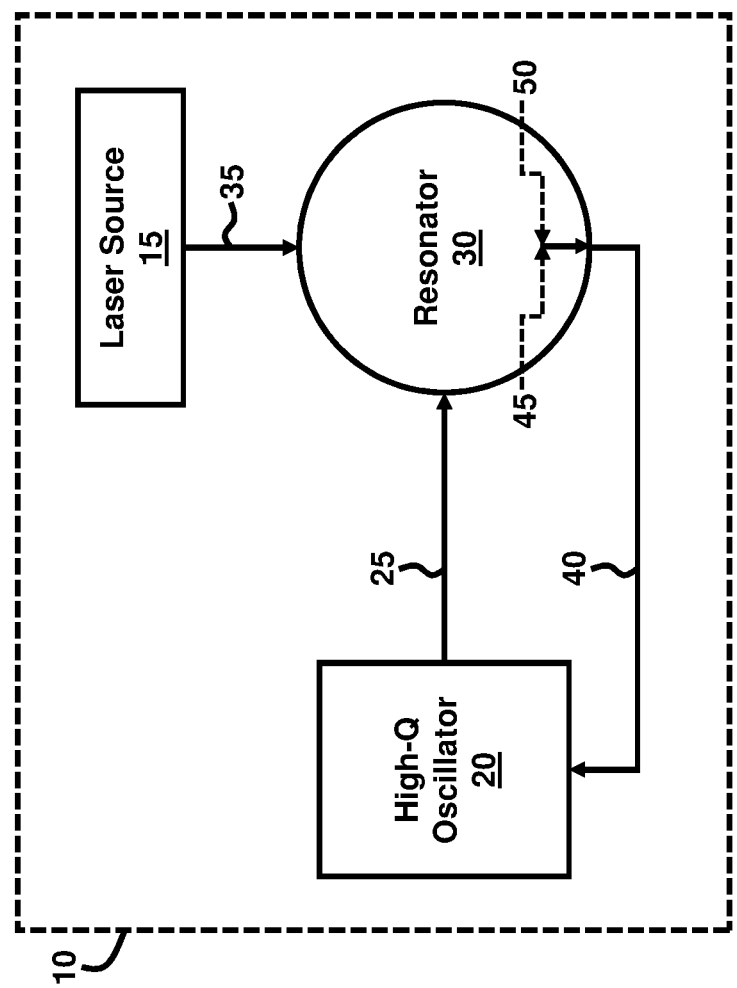
FIG. 2 is a block diagram illustrating a technique for locking the high-Q electro-optical oscillator in the optical system of FIG. 1, according to an embodiment herein.

As shown in FIG. 2, with reference to FIG. 1, the resonator 30 may lock the high-Q electro-optical oscillator 20 by beating a pair of resonator signals 45, 50 to measure a phase/frequency difference and provide the feedback signal 40 to the high-Q electro-optical oscillator 20 to reduce the phase/frequency draft/noise. According to an example, the various signals described herein may be optical signals. Furthermore, according to another example, the various signals described herein may be RF signals.

Figure 3:
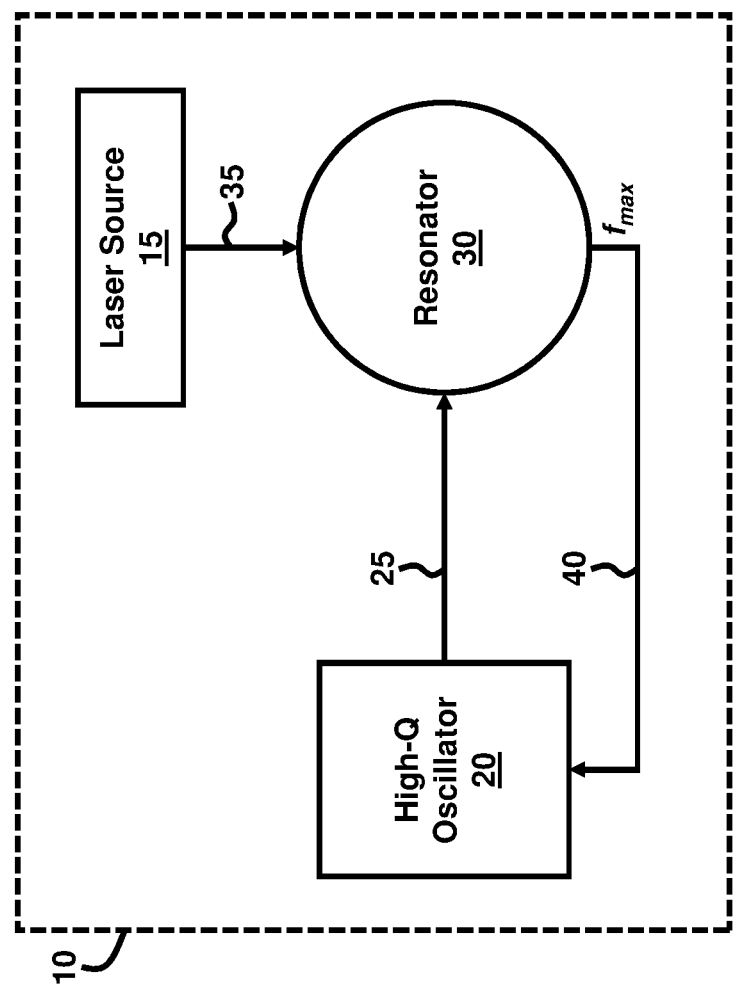
FIG. 3 is a block diagram illustrating another technique for locking the high-Q electro-optical oscillator in the optical system of FIG. 1, according to an embodiment herein.
Figure 4:
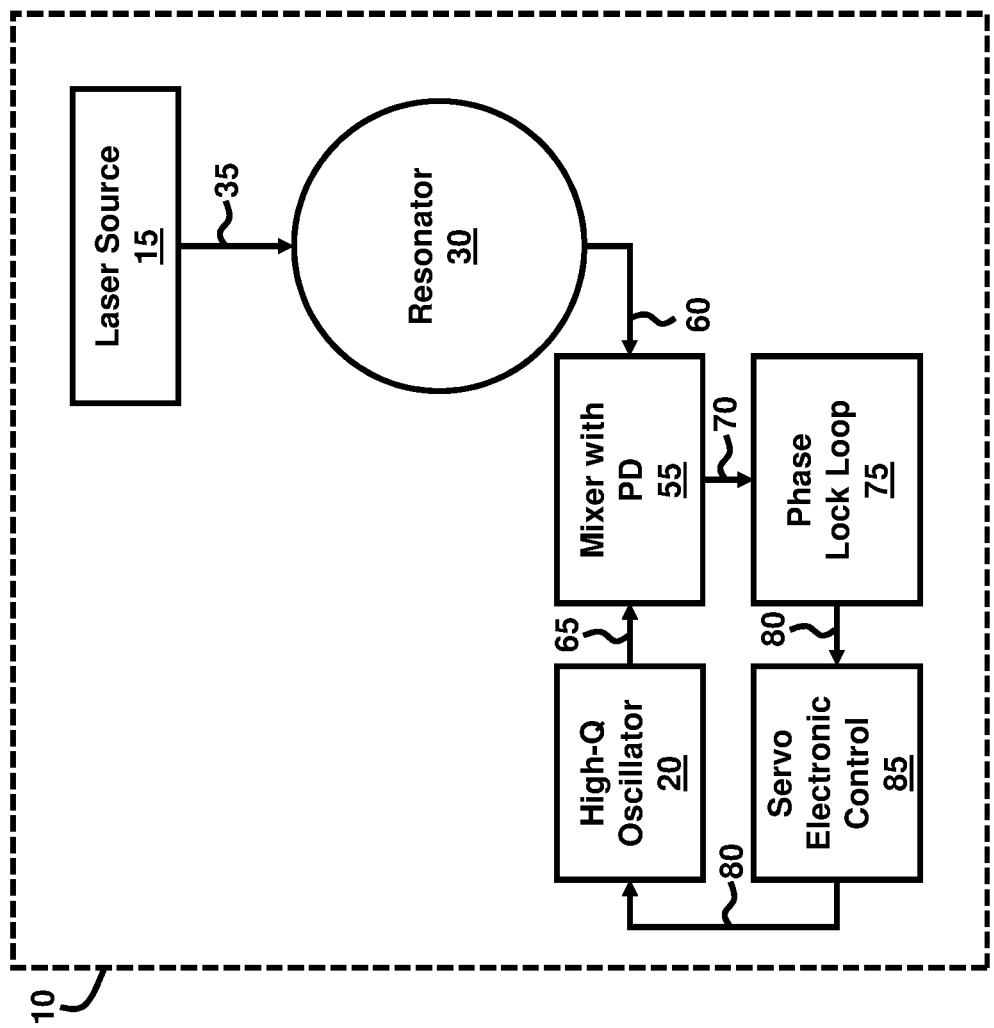
FIG. 4 is a block diagram illustrating the oscillator system of FIG. 1 illustrating signal mixing and processing, according to an embodiment herein.

As shown in FIG. 3, with reference to FIGS. 1 and 2, the resonator 30 may lock the high-Q electro-optical oscillator 20 by injecting the high-Q electro-optical oscillator signals 25 to the resonator 30 to tune the oscillator frequencies to obtain a maximum output power with frequency $f_{max}$ at an output of the resonator 30. As shown in FIG. 4, with reference to FIGS. 1 through 3, the electro-optical oscillator system 10 may comprise a mixer 55 (with a photodetector (PD)) to receive a first output signal 60 from the resonator 30, receive a second output signal 65 from the high-Q electro-optical oscillator 20, and generate a third output signal 70 that is a mixing product of the first output signal 60 and the second output signal 65.

The electro-optical oscillator system 10 may further comprise a phase lock loop circuit 75 to receive the third output signal 70 from the mixer 55 and provide a phase/frequency difference detection in the third output signal 70 to generate a fourth output signal and converts it to an electrical signal 80 that represents a phase/frequency error; and a servo electronic control circuit 85 to receive the electrical output signal 80 and convert the electrical output signal 80 to an electric bias to tune a frequency of the high-Q electro-optical oscillator 20 and transmit the output signal 80 in the electrical domain to the high-Q electro-optical oscillator 20. Accordingly, the embodiments herein may provide a technique for locking in the RF-electrical domain. Both the high-Q electro-optical oscillator 20 and the resonator 30 can generate a multi-optical mode, which can be beat at a photodetector (PD) to generate a RF microwave signal. Accordingly, the resonator generated RF-signal may be used as a reference to lock the RF-signal created by the high-Q electro-optical oscillator 20.

Figure 5B:
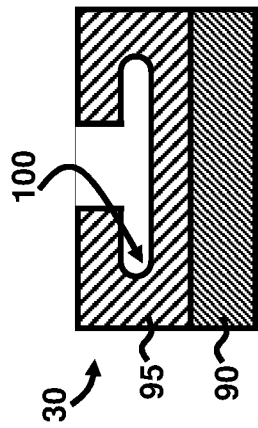
FIG. 5B is a cross-sectional side view schematic diagram illustrating the resonator of FIG. 5A, according to an embodiment herein.
Figure 5A:
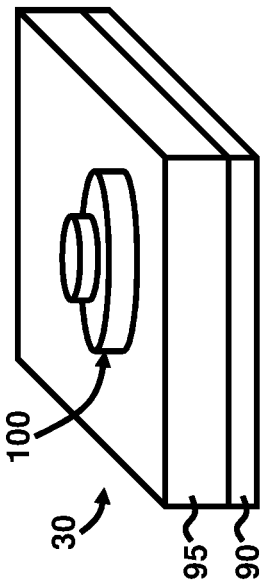
FIG. 5A is a perspective view schematic diagram illustrating the resonator of the optical system of FIG. 1, according to an embodiment herein.

As shown in FIGS. 5A and 5B, with reference to FIGS. 1 through 4, the resonator 30 may comprise a substrate 90 and an ENZ cladding layer 95 over the substrate 90, wherein the ENZ cladding layer 95 comprises the ENZ metamaterials. The resonator 30 may further comprise a vacuum/air cavity or tunnel waveguide 100 embedded in the ENZ cladding layer 95. In some examples, the substrate 90 may comprise silicon and the ENZ metamaterials may comprise ITO.

The vacuum/air cavity or tunnel waveguide 100 may comprise a disk configuration. The resonator 30 is configured by a refractive index contrast defined disk configuration, which operates as a vacuum/air cavity or tunnel waveguide 100 at the edge of the disk that is enclosed by the ENZ cladding layer 95. Light is propagated in whisper gallery mode that is mostly in vacuum where the refractive index does not change due to the environmental perturbations such as temperature or vibration, etc. The resonance frequency is determined by the round-trip optical path of the disk configuration of the resonator 30 as well as the interference with an external electromagnetic (EM) field acting upon the resonator 30. Since the resonator 30 is operating at an optical frequency, it is immune from the EM interference. The resonator 30 has a resonant optical frequency $f_{op}=m \times f_0$, where m is the number of modes, $f_0$ is the fundamental frequency. The fundamental wavelength $\lambda_0=C/f_0$, which is the round-trip optical path. $\lambda_0=n \times d$, where n is the effective refractive index of the ring path and d is the physical dimension of the resonator 30. Both temperature and vibration may change the physical dimension of the resonator 30.

In a general optical micro-resonator case, the environmentally induced frequency change is given by Equation (1):

$$\Delta f_{op} = m \times \Delta f_0 = m \times \left(\frac{\Delta n}{n} + \frac{\Delta d}{d}\right) f_0 \qquad (1)$$

In a typical micro-resonator containing $SiO_2$, $Si_3N_4$, Si, etc., $\Delta n$ can be significant due to temperature changes and vibration induced strain. In case of a material with thermal expansion $\alpha_{th}$, the Equation (1) can be written as Equation (2):

$$\frac{\Delta f_{op}}{f_0} \cong 1 + \alpha_{th} \Delta T + \left(\frac{1}{n_0}\right) \times \left(\frac{dn}{dT}\right) \Delta T \qquad (2)$$

Moreover, Δd can also be significant due to thermal expansion ($\cong \alpha_{th}\Delta T$) and deformation by vibration. In contrast, in a vacuum/air resonator embedded in ENZ metamaterial (e.g., in ENZ cladding layer 95), as provided by the embodiments herein, Δn is negligible. Δd can be less significant due to the geometry of the material which vacuum enclosed by the ENZ cladding layer 95. In addition, with the ENZ condition, optical phase changes very slowly in the ENZ media, thus environmentally induced small geometry variation has less effect on optical phase variation, and therefore generates less phase noise.

Figure 6:
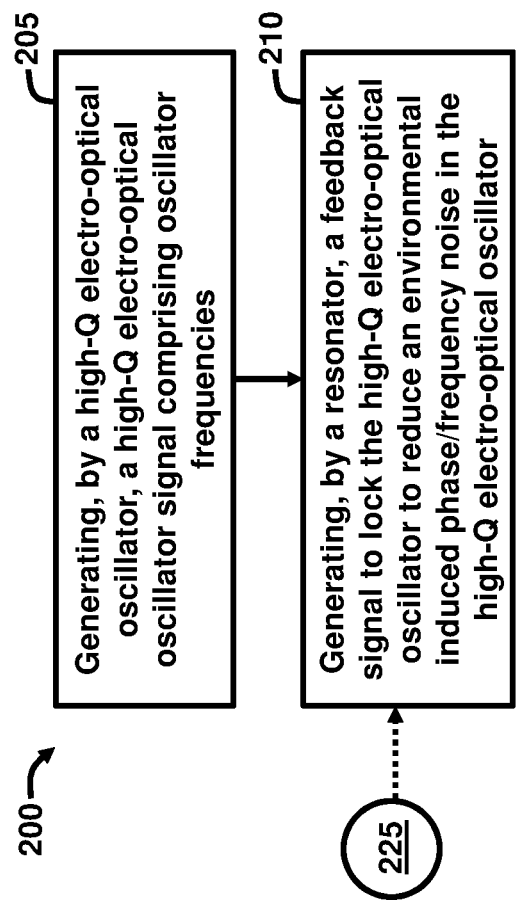
FIG. 6 is a flow diagram illustrating a method, according to an embodiment herein.

As shown in FIG. 6, with reference to FIGS. 1 through 5, a method 200 comprises generating (205), by a high-Q electro-optical oscillator 20, a high-Q electro-optical oscillator signal 25 comprising oscillator frequencies; and generating (210), by a resonator 30, a feedback signal 40 to lock the high-Q electro-optical oscillator 20 to reduce an environmental induced phase/frequency noise in the high-Q electro-optical oscillator 20, wherein the resonator 30 comprises epsilon-near-zero (ENZ) metamaterials.

Figure 7A:
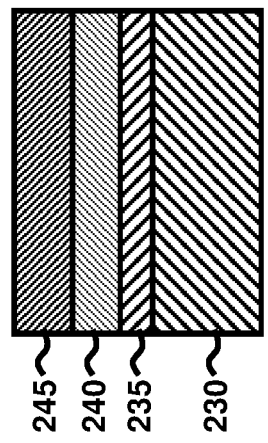
FIG. 7A is a cross-sectional view illustrating a first set of sequences of a manufacturing process, according to an embodiment herein.

The resonator 30 may be formed by a manufacturing process 225 shown sequentially in FIGS. 7A through 7H. As shown in FIG. 7A, the manufacturing process 225 comprises providing a semiconductor substrate 230. In an example, the semiconductor substrate 230 may comprise silicon. Next, the manufacturing process 225 comprises depositing a dielectric layer 235 on the semiconductor substrate 230. In an example, the dielectric layer 235 comprises silicon dioxide. Next, the manufacturing process 225 comprises depositing a first ENZ metamaterial layer 240 on the electrical insulator layer 235. In an example, the first ENZ metamaterial layer 240 comprises ITO.

Figure 7B:
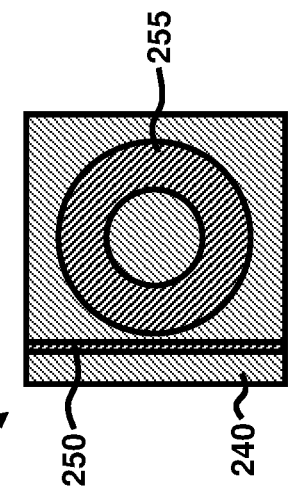
FIG. 7B is a cross-sectional view illustrating a second set of sequences of a manufacturing process, according to an embodiment herein.

As shown in FIG. 7B, the manufacturing process 225 may further comprise depositing a sacrificial material layer 245 on the first ENZ metamaterial layer 240. In an example, the first ENZ metamaterial layer 240 may be approximately 2 μm in thickness, and the sacrificial material layer 245 may be approximately 1.5 μm in thickness. In an example, the sacrificial material layer 245 comprises poly-Si, Ge, $Si_3N_4$, photoresist, or polymer, etc.

Figure 7C:
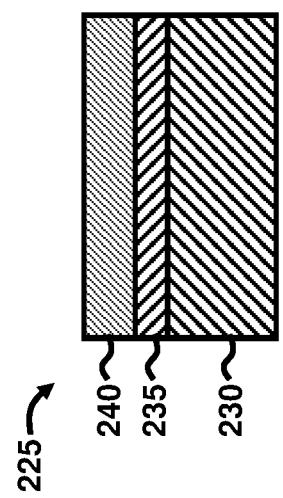
FIG. 7C is a cross-sectional view illustrating a third set of sequences of a manufacturing process, according to an embodiment herein.
Figure 7D:
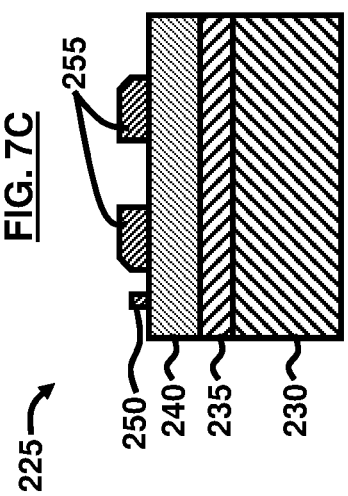
FIG. 7D is a top view illustrating a fourth set of sequences of a manufacturing process, according to an embodiment herein.

As shown in FIGS. 7C and 7D, the manufacturing process 225 may further comprise patterning the sacrificial material layer 245 to create a coupling waveguide structure 250 and a sacrificial ring structure 255. In an example, the patterning may involve a grey scale lithography process, but the patterning may involve other techniques also depending on the type of sacrificial material layer 245. The patterning may include a different dry etching step to etch the coupling waveguide structure 250 and sacrificial ring structure 255. The diameter of the sacrificial ring structure 255 may be based on the design need of the resonator 30, but in some examples, it can range from the sub mm to cm size.

Figure 7E:
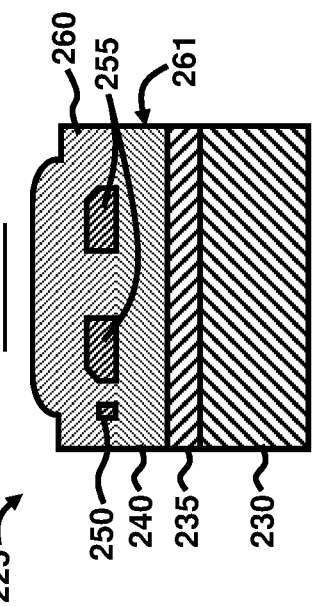
FIG. 7E is a cross-sectional view illustrating a fifth set of sequences of a manufacturing process, according to an embodiment herein.

As shown in FIG. 7E, the manufacturing process 225 may further comprise depositing a second ENZ metamaterial layer 260 on the patterned sacrificial material layer 245. In some examples, the second ENZ metamaterial layer 260 comprises ITO and is approximately 2 μm in thickness. Accordingly, the first ENZ metamaterial 240 may blend with the second ENZ metamaterial layer 260 thereby creating one continuous ENZ metamaterial layer 261.

Figure 7F:
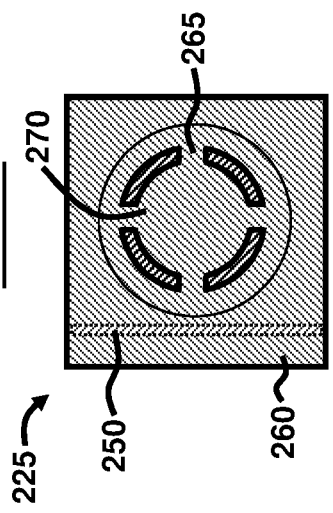
FIG. 7F is a top view illustrating a sixth set of sequences of a manufacturing process, according to an embodiment herein.

As shown in FIG. 7F, the manufacturing process 225 may further comprise patterning the second ENZ metamaterial layer 260 to create a plurality of holes 265 along an inner portion 270 of the sacrificial ring structure 255. The patterning may involve a lithography and etching process, according to an example. The distance from the edge of the outer ring and the open holes 265 is at least a few wavelengths so that light can be confined near the outer edge of the sacrificial ring structure 255.

Figure 7G:
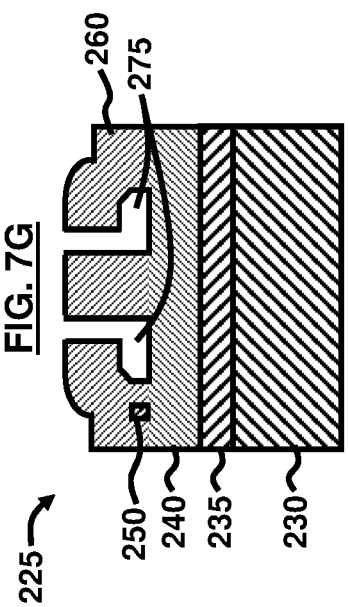
FIG. 7G is a cross-sectional view illustrating a seventh set of sequences of a manufacturing process, according to an embodiment herein.
Figure 7H:
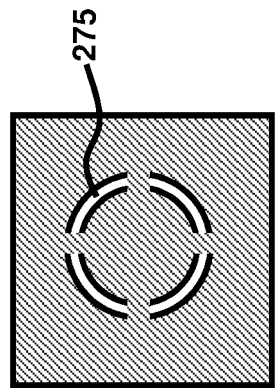
FIG. 7H is a top view illustrating an eighth set of sequences of a manufacturing process, according to an embodiment herein.

As shown in FIGS. 7G and 7H, the manufacturing process 225 may further comprise removing the sacrificial material layer 245 and sacrificial ring structure 255 to create an air ring 275 in the first ENZ metamaterial layer 240. In an example, if the sacrificial material layer 245 comprises silicon, then it can be removed by Xenon difluoride gas. The manufacturing process 225 may further comprise annealing the second ENZ metamaterial layer 260. In this regard, the second ENZ metamaterial layer 260 may undergo an annealing process for ε=0 to obtain the ENZ condition. This annealing process can be performed either before or after the removal of the sacrificial ring structure 255, and depends on the choice of the sacrificial material.

Figure 8:
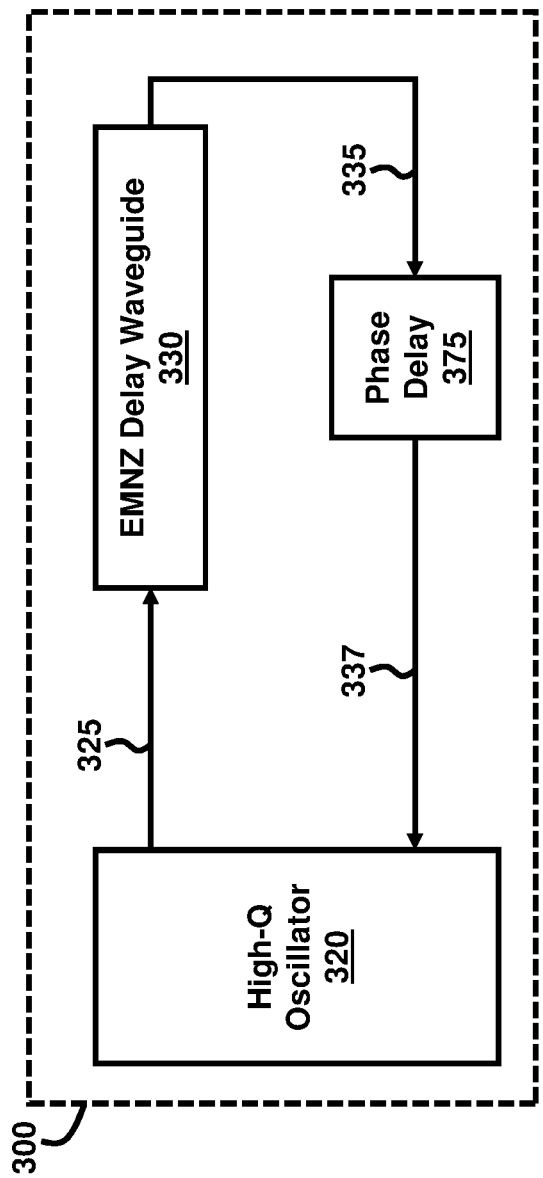
FIG. 8 is a block diagram illustrating an optical system with an EMNZ delay line, according to an embodiment herein.

As shown in FIG. 8, with reference to FIGS. 1 through 7H, an electro-optical oscillator system 300 comprises a high-Q electro-optical oscillator 320 to generate a high-Q electro-optical oscillator signal 325 comprising oscillator frequencies; an environment insensitive signal delay waveguide 330 comprising an epsilon- and mu-near-zero (EMNZ) metamaterial, wherein the signal delay waveguide 330 is to delay the high-Q electro-optical oscillator signal 325 and generate a delayed signal 335; and a phase delay circuit 375 to receive the delayed signal 335 from the signal delay waveguide 330 and provide an electrical feedback signal 337 to the high-Q electro-optical oscillator 320.

Figure 9:
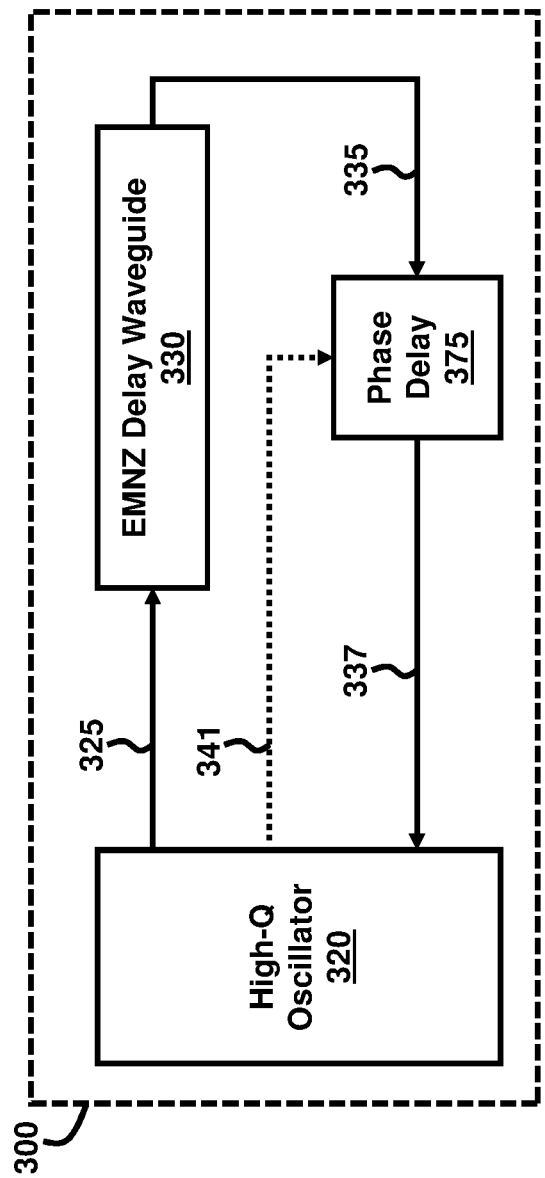
FIG. 9 is a block diagram illustrating a technique for providing a feedback signal to the high-Q electro-optical oscillator in the optical system of FIG. 8, according to an embodiment herein.

As shown in FIG. 9, with reference to FIGS. 1 through 8, the delayed signal 335 may be used to compare a no-delayed signal 341 with the high-Q electro-optical oscillator signal 325 for the electrical feedback signal 337 to correct an environmentally induced phase noise error of the high-Q electro-optical oscillator signal 325 due to environmental perturbations. In an example, the electrical feedback signal 337 may be used as a phase reference for correction of the environmentally induced phase noise error of the high-Q electro-optical oscillator signal 325.

Figure 10A:
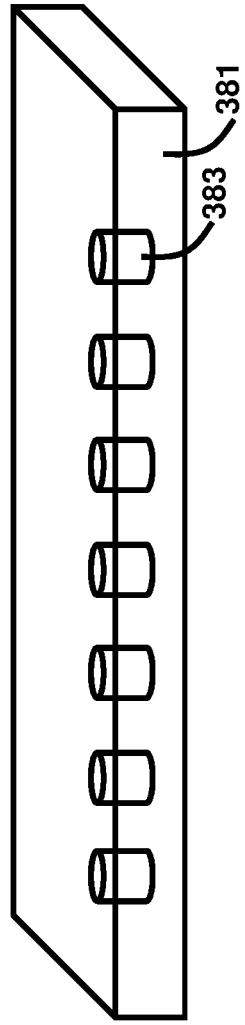
FIG. 10A is a perspective view schematic diagram illustrating an EMNZ waveguide, according to an embodiment herein.
Figure 10B:
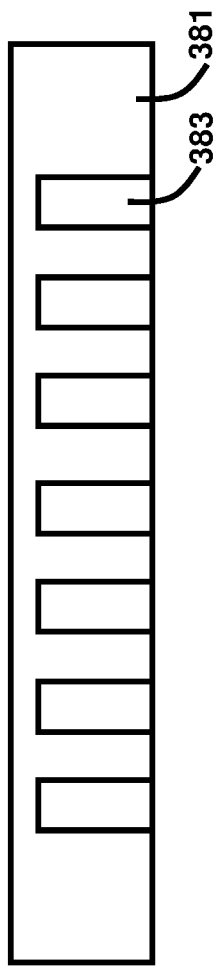
FIG. 10B is a cross-sectional side view schematic diagram illustrating the EMNZ waveguide of FIG. 10A, according to an embodiment herein.

As shown in FIGS. 10A and 10B, with reference to FIGS. 1 through 9, the signal delay waveguide 330 may comprise an epsilon-near-zero (ENZ) metamaterial host/cladding structure 381, and one or more dielectric rod/particles 383 each having a subwavelength size positioned in the ENZ metamaterial host/cladding structure 381. In some examples, the ENZ metamaterial host/cladding structure 381 comprises ENZ metamaterial (such as ITO, for example), and the subwavelength sized plurality of dielectric particles may each be configured as a post and may comprise a semiconductor material such as silicon, for example.

The signal delay waveguide 330 is configured based on the EMNZ media where the host material is ENZ (refractive index near zero), which can be used for the ENZ metamaterial host/cladding structure 381. The dielectric particles 383, which may be configured as a series of high index material beads, is located in the ENZ metamaterial host/cladding structure 381 and may serve as an inductor to create the EMNZ condition as well as an index guiding for light. Accordingly, the one or more dielectric rod/particles 383 may be arranged to permit light to propagate through the one or more dielectric rod/particles 383.

Figure 11:
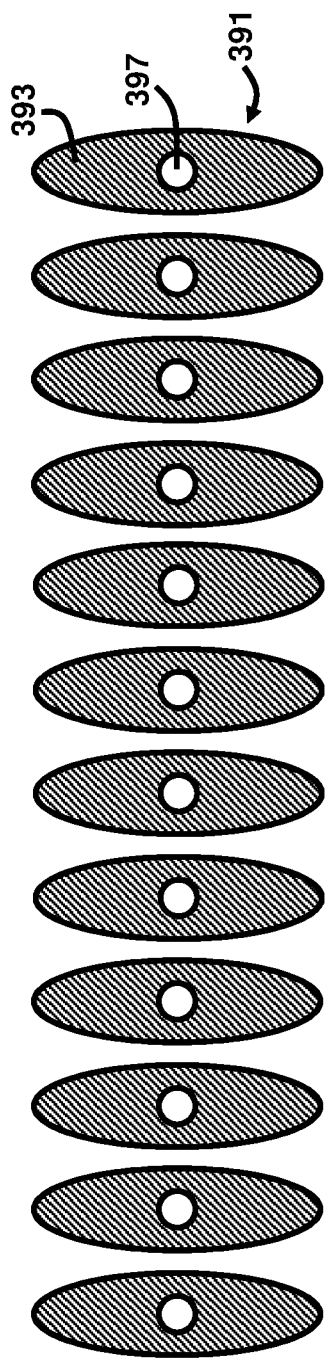
FIG. 11 is a cross-sectional top view schematic diagram illustrating an EMZ waveguide unit cell, according to an embodiment herein.

As shown in FIG. 11, with reference to FIGS. 1 through 10, the signal delay waveguide 330 may comprise a plurality of EMNZ unit cells 391 each comprising an ENZ metamaterial host/cladding structure 393; and a subwavelength sized particle disk 397 embedded in the ENZ metamaterial host/cladding structure 393. In some examples, the ENZ metamaterial host/cladding structure 393 comprises ENZ metamaterial (such as ITO, for example), and the subwavelength sized particle or disk 397 may be configured as a post and may comprise silicon. The plurality of EMNZ unit cells 391 may be configured to meet the EMNZ condition. Moreover, the plurality of EMNZ unit cells 391 may be arranged to permit light to propagate from unit cell to unit cell. The particle disk 397 may comprise silicon, according to an example.

The embodiments herein provide an environmentally insensitive solution for overcoming the frequency drift problem in precision oscillators and clocks. This is achieved by using an intrinsic environmental insensitive device configured to store or create a reference frequency to lock (feedback) a precision oscillator to maintain the frequency stability, which significantly reduces the SWaP-C of the precision frequency/time source. The embodiments herein use Epsilon-Near-Zero (ENZ) or Epsilon- and Mu-Near-Zero (EMNZ) metamaterials to develop an intrinsic environmentally insensitive optoelectronic cavity or waveguide device.

The embodiments herein stabilize a high-Q oscillator or clock by locking the oscillator with an ENZ or an EMNZ metamaterial-based intrinsic environmentally insensitive cavity device, or by providing feedback using an environmentally insensitive delay line. The embodiments herein can be used for stabilizing lasers. Furthermore, the embodiments herein can be used to build a small (chip scale) long holder-over clock, which is essential for providing positioning, navigation, and timing (PNT), such as for self-driving cars, and for various devices and systems that require small SWaP-C in a GPS-denied environment, or for GPS alternatives. The embodiments herein can also be used in RF communication and radar systems that require stable oscillators, and may be used for chip scale long-holding clocks.

The foregoing description of the specific embodiments will so fully reveal the general nature of the embodiments herein that others may, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein may be practiced with modification within the spirit and scope of the appended claims.

What is claimed is:

1. An electro-optical oscillator system comprising:
   a laser source;
   a high-Q electro-optical oscillator to generate a high-Q electro-optical oscillator signals comprising oscillator frequencies; and
   an optical environmentally insensitive resonator comprising epsilon-near-zero (ENZ) metamaterials, wherein the resonator is to receive a laser light from the laser source and generate a feedback signal to lock the high-Q electro-optical oscillator to reduce an environment induced phase/frequency noise in the high-Q electro-optical oscillator.

2. The electro-optical oscillator system of claim 1, wherein the resonator locks the high-Q electro-optical oscillator by beating a pair of resonator signals to measure a phase/frequency difference and provide the feedback signal to the high-Q electro-optical oscillator to reduce the phase/frequency draft/noise.

3. The electro-optical oscillator system of claim 1, wherein the resonator is to lock the high-Q electro-optical oscillator by injecting the high-Q electro-optical oscillator signals to the resonator to tune the oscillator frequencies to obtain a maximum output power at an output of the resonator.

4. The electro-optical oscillator system of claim 3, comprising a mixer to receive a first output signal from the resonator, receive a second output signal from the high-Q electro-optical oscillator, and generate a third output signal that is a mixing product of the first output signal and the second output signal.

5. The electro-optical oscillator system of claim 4, comprising:
   a phase lock loop to receive the third output signal from the mixer, provide a phase/frequency difference detection and generate an electrical output signal that represents a phase/frequency error; and
   a servo electronic control circuit to receive the electrical output signal and convert the electrical output signal to an electric bias to tune a frequency of the high-Q electro-optical oscillator.

6. The electro-optical oscillator system of claim 1, wherein the resonator comprises:
   a substrate;
   an ENZ cladding layer over the substrate, wherein the ENZ cladding layer comprises the ENZ metamaterials; and
   a vacuum/air cavity or tunnel waveguide embedded in the ENZ cladding layer.

7. The electro-optical oscillator system of claim 6, wherein the vacuum/air tunnel waveguide comprises a disk configuration.

8. A method comprising:
   generating, by a high-Q electro-optical oscillator, a high-Q electro-optical oscillator signal comprising oscillator frequencies; and
   generating, by a resonator, a feedback signal to lock the high-Q electro-optical oscillator to reduce an environmental induced phase/frequency noise in the high-Q electro-optical oscillator, wherein the resonator comprises epsilon-near-zero (ENZ) metamaterials.

9. The method of claim 8, wherein the resonator is formed by a manufacturing process comprising:
   providing a semiconductor substrate;
   depositing a dielectric layer on the semiconductor substrate; and
   depositing a first ENZ metamaterial layer on the dielectric layer.

10. The method of claim 9, wherein the manufacturing process further comprises:
    depositing a sacrificial material layer on the first ENZ metamaterial layer; and
    patterning the sacrificial material layer to create a coupling waveguide structure and a sacrificial ring structure.

11. The method of claim 10, wherein the manufacturing process further comprises:
    depositing a second ENZ metamaterial layer on the patterned sacrificial material layer;
    patterning the second ENZ metamaterial layer to create a plurality of holes along an inner portion of the sacrificial ring structure; and
    removing the sacrificial material layer and sacrificial ring structure to create an air ring in the first ENZ metamaterial layer.

12. The method of claim 8, wherein the manufacturing process further comprises annealing the second ENZ metamaterial layer.

13. An electro-optical oscillator system comprising:
   a high-Q electro-optical oscillator to generate a high-Q electro-optical oscillator signal comprising oscillator frequencies;
   an environment insensitive signal delay waveguide comprising an epsilon- and mu-near-zero (EMNZ) metamaterial, wherein the signal delay waveguide is to delay the high-Q electro-optical oscillator signal and generate a delayed signal; and
   a phase error detection circuit to receive the delayed signal from the signal delay waveguide and provide an electrical feedback signal to the high-Q electro-optical oscillator.

14. The electro-optical oscillator system of claim 13, wherein the delayed signal is used to compare a no-delayed signal with the high-Q electro-optical oscillator signal for the electrical feedback signal to correct an environmentally induced phase noise error of the high-Q electro-optical oscillator signal due to environmental perturbations.

15. The electro-optical oscillator system of claim 14, wherein the electrical feedback signal is used as a phase reference for correction of the environmentally induced phase noise error of the high-Q electro-optical oscillator signal.

16. The electro-optical oscillator system of claim 13, wherein the signal delay waveguide comprises:
   an epsilon-near-zero (ENZ) metamaterial host/cladding structure; and
   one or more dielectric rod/particles each having a sub-wavelength size positioned in the ENZ metamaterial host/cladding structure.

17. The electro-optical oscillator system of claim 16, wherein the one or more dielectric rod/particles are arranged to permit light to propagate through the one or more dielectric rod/particles.

18. The electro-optical oscillator system of claim 13, wherein the signal delay waveguide comprises a plurality of EMNZ unit cells each comprising:
   an ENZ metamaterial host/cladding structure; and
   a subwavelength sized particle or disk embedded in the ENZ metamaterial host/cladding structure.

19. The electro-optical oscillator system of claim 18, wherein the plurality of EMNZ unit cells are arranged to permit light to propagate from unit cell to unit cell.

20. The electro-optical oscillator system of claim 18, wherein the particle or disk comprises a semiconductor material.

* * * * *